(12) United States Patent
Berge et al.

(10) Patent No.: US 11,519,957 B2
(45) Date of Patent: Dec. 6, 2022

(54) BALL GRID ARRAY CURRENT METER WITH A CURRENT SENSE WIRE

(71) Applicant: International Business Machines Corporation, Armonk, NY (US)

(72) Inventors: Layne A. Berge, Rochester, MN (US); Matthew Doyle, Chatfield, MN (US); Kyle Schoneck, Rochester, MN (US); Thomas W. Liang, Rochester, MN (US); Matthew A. Walther, Rochester, MN (US); Jason J. Bjorgaard, Rochester, MN (US); John R. Dangler, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 601 days.

(21) Appl. No.: 16/583,464

(22) Filed: Sep. 26, 2019

(65) Prior Publication Data
US 2021/0096168 A1 Apr. 1, 2021

(51) Int. Cl.
*H01L 23/48* (2006.01)
*H01L 23/52* (2006.01)
(Continued)

(52) U.S. Cl.
CPC ......... *G01R 31/2813* (2013.01); *G01R 19/25* (2013.01); *H01L 21/4853* (2013.01);
(Continued)

(58) Field of Classification Search
CPC ........... H01L 21/4853; H01L 23/49816; H01L 24/16; H01L 25/0655; H01L 2224/16227;
(Continued)

(56) References Cited

U.S. PATENT DOCUMENTS 4,946,093 A 8/1990 Moorman
5,975,413 A 11/1999 Moen
(Continued)

FOREIGN PATENT DOCUMENTS

JP 5024587 B2 9/2012

OTHER PUBLICATIONS

Li et al., "A Current Probe for Measuring the Individual Ball Current in a Ball-Grid-Array Packaged Device," IEEE Transactions on Instrumentation and Measurement, vol. 62, Issue 12, Dec. 2013, pp. 3323-3332, IEEE.
(Continued)

*Primary Examiner* — Kimberly N Rizkallah
*Assistant Examiner* — Dilinh P Nguyen
(74) *Attorney, Agent, or Firm* — Mark Bergner; Nathan M. Rau

(57) ABSTRACT

Electrical current flow in a ball grid array (BGA) package can be measured by an apparatus including an integrated circuit (IC) electrically connected to the BGA package. Solder balls connect the BGA package to a printed circuit board (PCB) and are arranged to provide a contiguous channel for a current sense wire. A subset of solder balls is electrically connected to supply current from the PCB through the BGA package to the IC. The current sense wire is attached to the upper surface of the PCB, within the contiguous channel, and surrounds the subset of solder balls. An amplifier is electrically connected to the current sense wire ends to amplify a voltage induced on the current sense wire by current flow into the BGA package. A sensing analog-to-digital converter (ADC) is electrically connected to convert a voltage at the output of the amplifier into digital output signals.

9 Claims, 3 Drawing Sheets

(51) Int. Cl.
*G01R 31/28* (2006.01)
*H01L 23/00* (2006.01)
*H01L 25/065* (2006.01)
*H01L 21/48* (2006.01)
*G01R 19/25* (2006.01)
*H01L 23/498* (2006.01)
*B23K 101/42* (2006.01)

(52) U.S. Cl.
CPC ........ *H01L 23/49816* (2013.01); *H01L 24/16* (2013.01); *H01L 25/0655* (2013.01); *B23K 2101/42* (2018.08); *H01L 2224/16227* (2013.01); *H01L 2924/14* (2013.01)

(58) Field of Classification Search
CPC ........... H01L 2924/14; H01L 23/49838; H01L 25/16; H01L 2224/16225; H01L 2924/141; H01L 2924/1424; H01L 2924/1431; H01L 2924/1432; H01L 2924/1433; H01L 2924/15174; H01L 2924/15192; H01L 2924/15311
USPC .................................................. 257/777–778
See application file for complete search history.

(56) References Cited

U.S. PATENT DOCUMENTS

| | | | |
|---|---|---|---|
| 6,384,478 B1 | 5/2002 | Pour | |
| 6,781,218 B1* | 8/2004 | Wilsher | H01L 22/32 |
| | | | 257/691 |
| 7,378,745 B2* | 5/2008 | Hayashi | H01L 23/49827 |
| | | | 257/E23.067 |
| 7,679,162 B2 | 3/2010 | Dupuis et al. | |
| 7,755,083 B2 | 7/2010 | Lin | |
| 7,990,132 B2 | 8/2011 | Dupuis et al. | |
| 8,878,559 B2 | 11/2014 | Nakayama et al. | |
| 9,412,674 B1* | 8/2016 | Kim | H01L 22/34 |
| 2003/0008424 A1 | 1/2003 | Kajiwara et al. | |
| 2003/0029901 A1 | 2/2003 | Ming-Hsum et al. | |
| 2005/0253616 A1 | 11/2005 | Parker et al. | |
| 2009/0001573 A1 | 1/2009 | Jirawongsapiwat et al. | |
| 2010/0147840 A1 | 6/2010 | Dowd | |

OTHER PUBLICATIONS

Makayama et al., "Proposal of a current measurement technique for each pin of a BGA package," International Symposium on Electromagnetic Compatibility—EMC Europe, Sep. 2012, IEEE, 6 pages.

Weaver et al., "Measurement of Via Currents in Printed Circuit Boards Using Inductive Loops," 2006 IEEE Electrical Performance of Electronic Packaging, 2006, pp. 37-40.

Qin et al., "Geometry effect on mechanical performance and fracture behavior of micro-scale ball grid array structure Cu/Sn—3.0Ag—0.5Cu/Cu solder joints," Microelectronics Reliability, vol. 55, Issue 8, Jul. 2015, pp. 1214-1225.

Berge et al., "Ball Grid Array Current Meter with a Current Sense Mesh," U.S. Appl. No. 16/583,494, filed Sep. 26, 2019.

Berge et al., "Ball Grid Array Current Meter with a Current Sense Loop," U.S. Appl. No. 16/583,521, filed Sep. 26, 2019.

List of IBM Patents or Patent Applications Treated as Related, Signed Sep. 26, 2019, 2 pages.

\* cited by examiner

BALL GRID ARRAY CURRENT METER WITH A CURRENT SENSE WIRE

BACKGROUND

The present disclosure generally relates to monitoring the performance of integrated circuits (ICs) mounted on ball grid array (BGA) packages. In particular, this disclosure relates to measuring, through the use of a current sense wire, current flow through a BGA package to an IC.

An IC, also known as a "microchip," silicon or computer "chip," is a specially prepared piece of silicon, or other semiconductor material, into which a complex electronic circuit is etched and formed using a photolithographic process. IC types can include computer processors, memory, analog, and customizable devices. ICs can be relatively fragile, and therefore are often mounted on and/or surrounded by a protective, supportive ceramic or plastic package. Electrical connections to the chip can be provided through metal contacts, which can include pins or solder balls located on the exterior of the chip package.

ICs can have certain advantages over comparable discrete circuits, such as relatively low-cost and high-performance. The cost of an IC can be relatively low, resulting from the large number, e.g., millions, of transistors that can be simultaneously printed as a complete functional unit by photolithographic techniques, rather than constructing an equivalent circuit from individually fabricated transistors. Performance of an IC can be significantly higher than an equivalent discrete circuit, due to the high density and relatively low electrical interconnect parasitics between active devices such as transistors. Types of ICs can include analog, digital and "mixed signal" chips, i.e., chips that incorporate both analog and digital functions on the same silicon die.

A printed circuit board (PCB), can be used to mechanically support and electrically connect electronic components using conductive paths or signal traces etched from copper sheets laminated onto non-conductive substrates. Multiple copper/insulator layer pairs, also known as "cores," can be laminated together in the fabrication of the PCB. The number and arrangement of cores can be designed to fit the needs of a variety of applications.

Vertical interconnect structures (vias) can be used to interconnect conductive signal traces between various conductive layers within the PCB. Copper shapes or areas can be used for power and ground distribution to components mounted on the PCB. The interconnect structures in the PCB can be designed to be physically and electrically compatible with the components the PCB can be used to interconnect.

SUMMARY

Embodiments can be directed towards an apparatus for measuring electrical current flow in a ball grid array (BGA) package. The apparatus can include an integrated circuit (IC), electrically connected to the BGA package and a BGA package. The BGA package can have a set of solder balls electrically connected to a corresponding first set of attachment pads located on a lower surface of the BGA package. The set of solder balls can be arranged to provide a contiguous channel suitable to contain a current sense wire. The apparatus can also include a subset of the set of solder balls that is electrically connected to supply, from a printed circuit board (PCB), through the BGA package, current to the IC. The apparatus can also include the PCB. The PCB can include a second set, on an upper surface of the PCB that opposes the lower surface of the BGA package, of attachment pads positionally corresponding to the first set of attachment pads. The PCB can also include a current sense wire attached to the upper surface of the PCB and located in, when the BGA package is attached to the PCB, the contiguous channel. The current sense wire can surround the subset of solder balls. The apparatus can also include an amplifier electrically connected to ends of the current sense wire. The amplifier can be configured to amplify a voltage induced on the current sense wire by current flow into the BGA package. The apparatus can also include a sensing analog-to-digital converter (ADC) electrically connected to and configured to convert, into digital output signals, a voltage at the output of the amplifier.

Embodiments can also be directed towards a method of assembling an apparatus to measure electrical current flow in a BGA package. The method can include selectively applying a conductive attachment material to a first set of attachment pads located on an upper surface of a PCB and selectively placing solder balls onto attachment pads of the first set of attachment pads. The method can also include reflowing the solder balls to bond them to the attachment pads of the first set of attachment pads. The method can also include attaching a current sense wire into a contiguous channel, on the upper surface of the PCB, the contiguous channel formed by selective placing and reflow of the solder balls to the first set of attachment pads. The method can also include attaching a BGA package to the PCB, the BGA package including an electrically connected IC. The attaching can include aligning the BGA package with the PCB. The BGA package can have a second set of attachment pads, located on a lower surface of the BGA package, positionally corresponding to the first set of attachment pads. The second set of attachment pads can include an applied conductive attachment material. The attaching can include positioning the BGA package so that the second set of attachment pads is adjacent to corresponding solder balls and connecting the conductive attachment material to the second set of attachment pads and to the solder balls to create the apparatus.

Embodiments can also be directed towards a method of operating an apparatus to measure electrical current flow in a BGA package. The method can include monitoring, with a current sense wire, a voltage induced by supply current flowing into a BGA package, the BGA package including at least one IC and amplifying, with an amplifier circuit, the monitored voltage to produce an amplified voltage. The method can also include converting, with an ADC, the amplified voltage into a digital value representing the supply current and transmitting, with the ADC, the digital value to external logic device. The method can also include logging, with the external logic device, the digital value and a corresponding time value and initiating, with the external logic device, in response to the digital value exceeding a threshold, a corrective action.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, serve to explain the principles of the disclosure. The drawings are only illustrative of certain embodiments and do not limit the disclosure.

Figure 1:
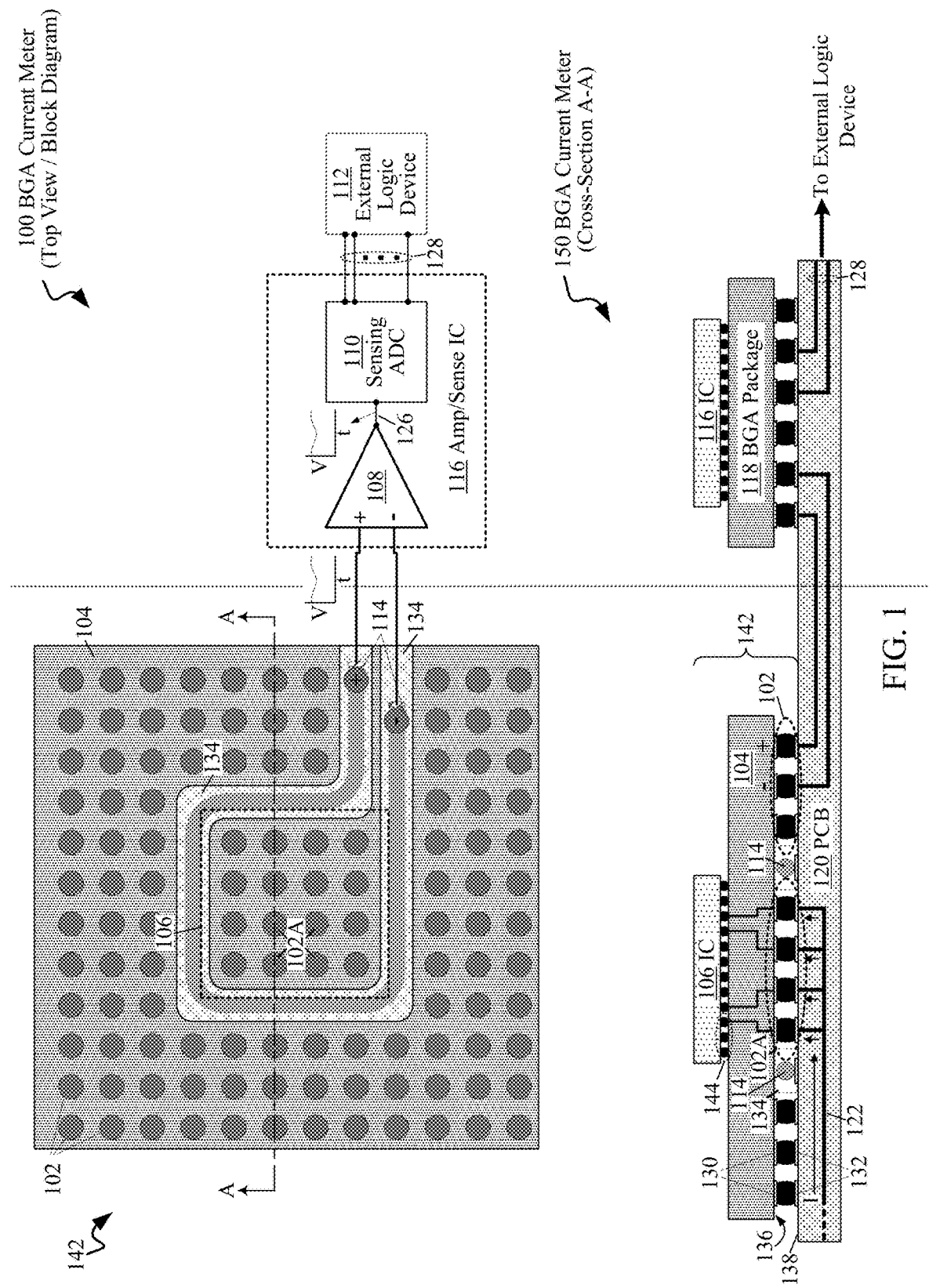
FIG. 1 depicts includes top, block diagram and cross-sectional views depicting a ball grid array (BGA) current meter, according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing accurate, in-situ or "in place" measurements of supply current provided to integrated circuits (ICs) that are mounted on ball grid array (BGA) packages. Such ICs can be used in electronic equipment such as servers, which can be used to provide data to clients attached to a server through a network. Such servers can include, but are not limited to web servers, application servers, mail servers, and virtual servers. While not necessarily limited thereto, embodiments discussed in this context can facilitate an understanding of various aspects of the disclosure. Certain embodiments can also be directed towards other equipment and associated applications, such as providing accurate, in-situ measurements of supply current provided to ICs mounted on BGA packages within electronic equipment such as computing systems, which can be used in a wide variety of computational and data processing applications. Such computing systems can include, but are not limited to, supercomputers, high-performance computing (HPC) systems, and other types of special-purpose computers. Embodiments may also be directed towards providing accurate, in-situ measurements of supply current provided to ICs located within consumer and small office/home office (SOHO) electronic equipment such as personal computers, laptops, mobile and network server devices.

The terms "attachment pad," and "BGA pad" can be used interchangeably herein in reference to a metallic pad used to form an electrical and mechanical interconnection to an IC package or a printed circuit board (PCB). Such pads can include metals such as copper or copper alloys, and can be arranged in arrays that are positionally consistent with solder balls on a BGA electronic package. In the context of the present disclosure, attachment pads can be used as locations on which to place and reflow solder balls to electrically and mechanically interconnect an IC package to a PCB.

For ease of discussion, the terms "solder, "solder paste" and "solder balls" are used generally herein in reference to a conductive attachment material used to form a durable mechanical and electrical interconnection between an IC package and a PCB. While solder paste is commonly used as a conductive attachment material between an IC package and a PCB, other materials can also be used for such purposes. For example, a conductive epoxy or conductive elastomeric material can be used to provide electrical and mechanical conductivity between an IC package and a PCB. Also for ease of discussion, application and reflow method operations discussed herein are directed towards the use of solder paste, however it can be easily understood that variations of these operations applicable to such materials as conductive epoxy or conductive elastomeric material can be used in certain embodiments.

For ease of discussion it can be understood that in-situ IC current measurements are generally taken for an IC that is electrically and physically attached to a host PCB. As such, a fully functional and robust physical and electrical configuration is maintained between the IC and an associated IC package and PCB. For example, if the IC is a processor IC, it is configured to run a full instruction workload at a normal, i.e., not compromised/reduced, clock frequency. In such a configuration no adjustments or derating factors are made or applied to operating parameters such as supply voltage, operating frequency, power dissipation and the like. No operational compensation is made to accommodate supplementary current probes or other types of instrumentation/diagnostic hardware. In view of the above, in-situ IC current measurements can be appreciated to be accurate representations of the actual current consumption of an IC in a "real-world" functional environment, in contrast to a "bring-up" or laboratory environment, which may not be able to provide such accurate measurement results.

The accuracy of in-situ IC current measurements can cause them to be particularly useful and sought after for a variety of purposes. For example, such current measurements can be used to enable correlation between IC power simulation results and actual IC power consumption, and thus provide valuable insights into IC current simulation deficiencies. IC current measurements can also be used to assist in IC debugging activities, monitoring current usage in various IC voltage domains, and providing insight into interactions between various IC supply voltage domains. According to embodiments, a current gradient across the IC package, i.e., distribution amongst BGA connections and vias, can be monitored. In some embodiments, current spikes and/or power draw that exceed design specification(s) can be monitored and detected, allowing corrective actions such as shutting down the electronic system containing the IC before any product damage occurs. According to embodiments, IC supply currents and corresponding time values can be logged and further analyzed for correlations, operating ranges and other trends.

In-situ, dynamic IC current measurements (both AC and DC) can be very difficult to perform, due to the decreasing physical dimensions and increasing integration of electrical interconnect, e.g., BGA structures used to interconnect ICs to PCBs. The integration of power distribution structures such as power planes and wires within PCBs, IC packages and ICs also serve to make such power distribution structures increasingly inaccessible for the purposes of performing in-situ IC current measurements.

IC current measurements can be taken through the use of a variety of added hardware devices and techniques. For example, resistive "current probes" can be inserted between the IC BGA package and its host PCB, allowing measurement of a voltage drop proportional to current flow across the resistive probe. Other measurement techniques can be employed which involve the use of added hardware elements such as interposer cards, flex cables incorporating magnetic loops, holes placed in host PCBs and other types of hardware additions and/or modifications.

While such techniques may allow IC current measurements, generally adding or significantly modifying existing hardware components can be very disruptive and invasive of the original system, i.e., IC, IC package and PCB configuration. Such disruptive solutions can be prohibitively expensive and complicated, e.g., requiring partial or full disassembly of the electronic system. Such solutions can also require the electronic system to be operated in a compromised configuration, for example, with a reduction of clock frequency, data bus speed, supply voltage, operational temperature and/or workload. Such a compromised configuration can diminish the accuracy of resulting current measurements. In addition, such solutions may only provide for current measurements on a limited number of BGA solder balls, which can greatly reduce the usefulness of such measurements.

Embodiments of the present disclosure are directed towards a current sense wire that is located within a contiguous channel among a field of solder balls used to interconnect an IC package to an associated PCB. The current sense wire is placed so as to surround one or more solder balls that conduct supply current from the PCB, through the IC package to the IC. Supply current flow through the solder balls surrounded by the current sense wire causes magnetic flux to induce a corresponding voltage potential, proportional to the current flow, on the current sense wire. This potential is then amplified by an amplifier, and subsequently converted to a digital value by an analog-to-digital converter (ADC). The resulting ADC output directly corresponds to the IC supply current magnitude.

Embodiments of the present disclosure can be useful in providing cost-effective in-situ IC current measurement apparatuses for use with current-consuming electronic devices, by using existing and proven PCB, interconnect and IC technologies. Embodiments can be useful in providing for the monitoring of IC supply currents on one or more solder balls supplying power to the IC. Embodiments can provide relatively non-invasive in-situ monitoring of IC supply current without requiring additional/supplementary hardware and/or the disassembly of the IC or IC BGA package from the PCB. As a result, the time, cost, and effort involved in performing IC current measurements can be effectively managed, and overall system performance reductions can be avoided, which can result in enhanced accuracy IC current measurements. Embodiments of the present disclosure can provide for monitoring interactions between supply voltage domains on an IC package and an IC die.

Some embodiments can provide for monitoring of current distribution across a field of solder balls over time, which can yield data useful in predicting and monitoring IC and IC package reliability. Such data can be particularly useful in providing insights into physical phenomenon such as solder ball connection degradation due to metallurgy issues. According to embodiments, one or more current sense wires can be positioned within the field of solder balls, which can allow monitoring of IC supply currents within multiple regions of an IC die, and/or within multiple supply voltage domains. An electronic system designed according to certain embodiments can be compatible with existing and proven electronic components and PCBs, and can be a useful and cost-effective way to monitor IC supply current(s).

Certain embodiments relate to in-situ measuring of IC supply current flowing through one or more solder balls attached to an IC package. FIG. 1, view 100 includes top view and block diagram depictions of a BGA current meter apparatus, and FIG. 1, view 150 includes a cross-sectional view depicting the BGA current meter apparatus, according to embodiments of the present disclosure.

BGA current meter views 100 and 150 can be useful in providing an understanding of an apparatus that can be used to measure dynamic, in-situ supply current flowing through a BGA package 104 into an IC 106. The left portion of views 100 and 150 depict top and cross-sectional views, respectively, of an assembly 142 that includes an IC 106 electrically and physically mounted on a BGA package 104, which is electrically and physically attached to a PCB 120. The left portions of views 100 and 150 can be useful in depicting a "sensing" portion of a BGA current meter which converts supply current-induced magnetic flux into a voltage on current sense wire 114.

The right portion of views 100 and 150 can be useful in depicting a block diagram and a cross-sectional view, respectively, of an amplifier/sense IC 116 electrically and physically mounted on a BGA package 118, which is electrically and physically attached to PCB 120. These portions of views 100 and 150 can be useful in depicting an "amplifying/conversion" portion of the BGA current meter which receives the voltage produced in the "sensing" portions of the views and subsequently amplifies it and converts the amplified voltage to a set of digital signals that represent both the magnitude of the current flow through BGA package 104 into IC 106.

The left portions of views 100 and 150 depict assembly 142 that includes an IC 106 electrically and physically connected by C4s 144 onto a BGA package 104. According to embodiments, IC 106 can be a processor or central processing unit (CPU), an application-specific integrated circuit (ASIC), a mixed signal IC, an analog IC, a graphics processing unit (GPU), or other type of IC. In some embodiments an additional IC can be physically and electrically connected to the BGA package and can receive current from a same set of solder balls as the IC 106.

According to embodiments, BGA package 104 can be a single or multi-layer IC package including, but not limited to, a ceramic or organic IC package. BGA package 104 is electrically and physically connected to PCB 120 by solder balls 103. According to embodiments, solder balls 102A are a subset of the set of solder balls 102, and are electrically connected to supply current to IC 106. Solder balls 102/102A are electrically and physically connected to a corresponding set of attachment pads 132 located on a lower surface 136 of the BGA package 104. Solder balls 102/102A are also electrically and physically connected to set of attachment pads 132 located on an upper surface 138 of the PCB 120 that opposes the lower surface 136 of the BGA package 104. The set of attachment pads 132 positionally correspond to the set of attachment pads 130.

View 150 includes electrical wiring interconnecting C4s 144 of IC 106 to corresponding solder balls 102A. This electrical wiring can be used to carry supply current through BGA package 104 to IC 106. According to embodiments, current supply wire 122 of PCB 120 is electrically connected to the solder balls 102A, and is also electrically connected to a current source (not depicted) to supply current "I" to IC 106 through the BGA package 104 and the solder balls 102A. According to embodiments, solder balls 102A are a subset of the set of solder balls 102.

According to embodiments, a contiguous channel 134, suitable to contain the current sense wire 114, is formed by the arrangement of solder balls 102. In some embodiments, the contiguous channel 134 can be defined as a contiguous space formed between existing solder balls by non-population of solder balls on certain attachment pads of a regular array pattern of attachment pads. It is contemplated that an IC package designer can also specify solder ball diameter and pitch/spacings that allows sufficient space for the insertion of one or more current sense wires 114 between solder balls arranged in a fully populated regular array formation.

In embodiments, the current sense wire 114 is attached to the upper surface 138 of the PCB 120 and located within the contiguous channel 134. The current sense wire 114 is positioned in order to surround the subset 102A of the solder balls 102. In embodiments, all solder balls 102A that are surrounded by a current sense wire 114 loop all conduct only incoming supply current for one particular voltage domain, i.e., from one supply voltage net, e.g., $V_{DD}$. According to embodiments, the current sense wire 114 loop is not configured to surround ground (GND) signals, signals from other voltage domains, data signals or control signals.

For ease of illustration and discussion, only one current sense wire 114 and one corresponding supply voltage domain are depicted and discussed. According to embodiments, however, a plurality of current sense wire 114 loops can be used to measure supply current for portions of the same voltage net, e.g., $V_{DD}$. This configuration can be useful in measuring or isolating high current usage or spikes to a particular portion of an IC. Similarly, a plurality of current sense wire 114 loops can be also used to measure supply current for a variety of supply voltage nets electrically connected to an IC. For example, one of current sense wire 114 loop can be positioned to surround solder balls electrically connected to a 1.0 V supply net, while another current sense wire 114 loop can be positioned to surround solder balls electrically connected to a 2.5 V supply net.

Embodiments can include a current sense wire 114 that can surround a larger or smaller number of solder balls than are depicted in FIG. 1. For example, a current sense wire 114 can surround only a single solder ball, or it can surround a very large portion of solder balls, provided that the enclosed solder balls are all configured to conduct the same supply voltage to the IC 106.

Although only one "loop" is depicted in FIG. 1, according to embodiments, current sense wire 114 can include a single "turn" or loop, or multiple turns or loops adjacent, i.e., on top, or beside each other, within the contiguous channel 134.

Current sense wire 114 is useful in converting supply current-induced magnetic flux from solder balls surrounded by current sense wire 114 into a voltage that represents the current flow through the solder balls. It is estimated that supply current flowing through solder balls can be in an approximate range between 10 mA and 1 A. It is also estimated that the voltage induced in the current sense wire 114 loop by magnetic flux resulting from supply current flow can be in an approximate range between 1 μV and 10 mV.

According to embodiments, the current sense wire 114 can be fabricated from a metal including, but not limited to, aluminum, copper, copper alloys and various other metals and alloys. A non-limiting example of current sense wire 114 can include wire consistent with wires used to construct various magnetic apparatus such as transformers, coils, chokes, and the like. In some embodiments the current sense wire can include a laminated outer insulating layer including, but not limited to: polyimide, polyamide, polyvinyl formal (Formvar), polyurethane, polyester, polyester-polyimide, polyamide-polyimide, amide-imide, polymer and insulating varnish.

The right portion of views 100 and 150 depicts an amplifier/sense IC 116 that includes an amplifier 108 electrically connected to a sensing ADC 110. The amplifier/sense IC 116 includes an amplifier 108 having differential inputs electrically interconnected by wires and solder balls 102, to the ends of current sense wire 114. As depicted in FIG. 1, a positive "+" and a negative "−" terminal of the current sense wire 114 are electrically connected to a corresponding positive "+" and a negative "−" terminal of the amplifier 108. According to embodiments, amplifier 108 can include a variety of types of amplifiers, including an operational amplifier (op-amp).

Amplifier output 126 is electrically connected to an input of a sensing ADC 110, which can be used to convert the amplified voltage to a set of digital signals that represent both the magnitude of the current flow through BGA package 104 into IC 106.

According to embodiments, sensing ADC 110 can be a flash ADC, a resistor ladder ADC, a parallel comparator ADC, a successive-approximation ADC and a counter-type ADC. An IC designer can select a particular type of ADC in order to meet particular design criteria such as conversion speed, power usage or IC area consumption.

In some embodiments, as depicted in FIG. 1, the amplifier 108 and sensing ADC 110 can be incorporated into a single amplifier/sense IC 116, electrically and physically mounted on a BGA package 118, which is electrically and physically attached to PCB 120. In some embodiments, the amplifier 108 and sensing ADC 110 can be electrically interconnected discrete components.

Sensing ADC 110 is electrically connected to and configured to transmit binary numbers representing the magnitude of current flow sensed by current sense wire 114 through digital outputs 128 to external logic device 112. In some embodiments, digital outputs 128 can include any number of wires needed to represent a corresponding precision of the binary number representing the magnitude of current flow. For example, according to embodiments digital outputs 128 can include 8, 16, 32 or 64 wires, in accordance with the precision of the binary number represented by digital outputs 128.

External logic device 112 can be, for example, a processor or processor core, a computer system, a service processor, a test instrument and an external logic IC configured to receive binary number from sensing ADC 110. External logic ICs, can include, for example, ASICs, special-purpose custom ICs, programmable logic devices (PLDs), Field Programmable Gate Arrays (FPGAs), and the like. In some embodiments the external logic device can be located on the PCB, and in some embodiments, the external logic device can be in a location remote to the PCB.

In some embodiments the external logic device 112 can be electrically interconnected and configured to initiate a corrective action in response to receiving digital output signals representing a current that is above a predetermined threshold. For example, an external logic device 112 that is a service processor of a computer or server system can, in response to detecting current that is above a "shutdown threshold," can initiate saving a machine state and/or vital data, followed by initiating a shutdown of power to the IC experiencing a current surge. These actions can be performed, for example, in conjunction with commands or instructions issued to a hypervisor, or other hardware and/or software components of the computer or server system.

Figure 2:
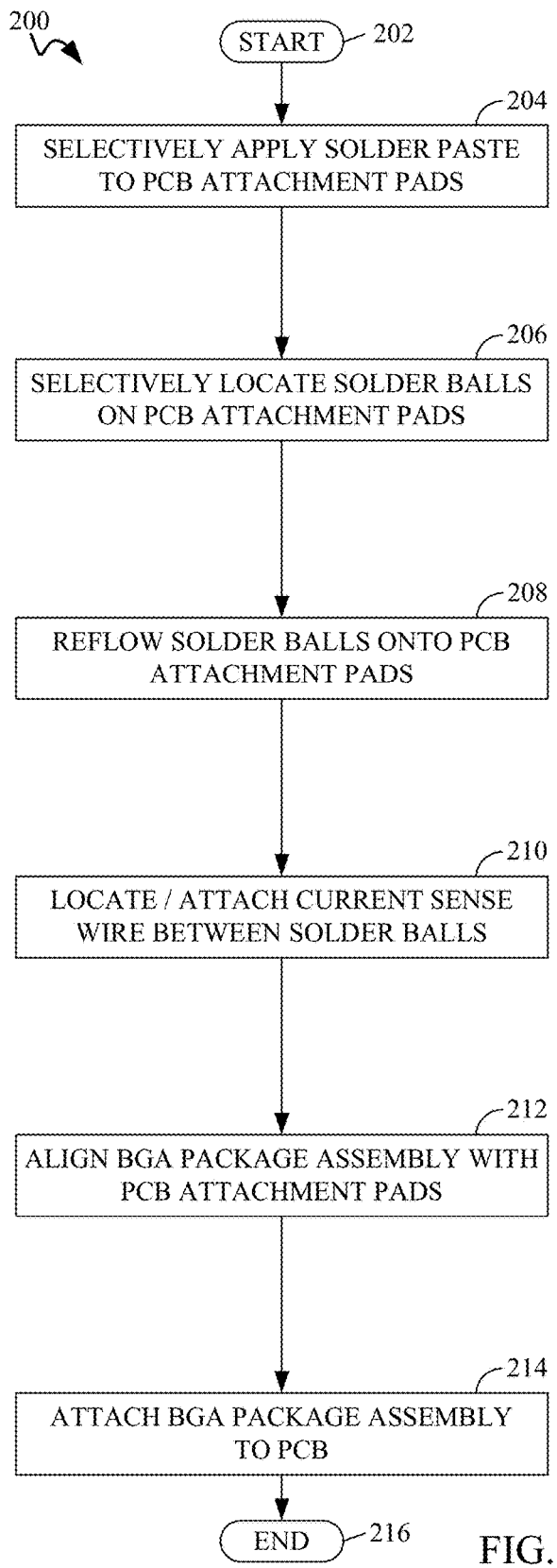
FIG. 2 includes a flow diagram and corresponding process diagram views depicting a method for manufacturing an apparatus to measure current flow into a BGA package, according to embodiments consistent with the figures.
Figure 2:
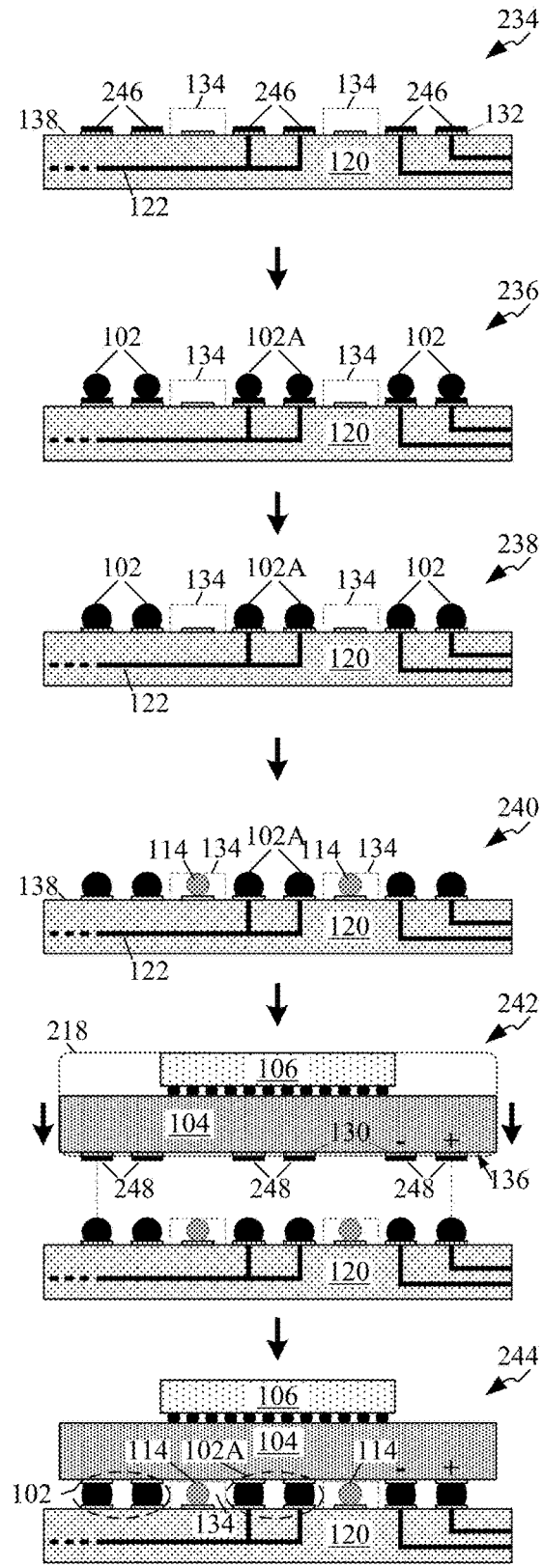

FIG. 2 includes a flow diagram 200 and a sequential set of six corresponding cross-sectional side process diagram views 234-244 depicting a method for assembling a BGA current meter apparatus 100, FIG. 1 to measure electrical current flow into a BGA package 104, according to embodiments consistent with the figures. These process diagram views illustrate an example process; other views and operations can be possible. An apparatus formed by these process operations can be consistent with BGA current meter 100, FIG. 1, and can provide for in-situ dynamic supply current measurements for ICs mounted on BGA packages.

The execution of method 200 can result in an apparatus that provides non-invasive in-situ monitoring of IC supply current without requiring additional/supplementary hardware and/or the disassembly of the IC or IC BGA package from the PCB. According to embodiments, such in-situ monitoring of IC supply current can be used to provide robust protection for electronic systems and valuable IC performance insights to IC designers. Embodiments of the present disclosure are generally consistent with existing ICs, electronic packages, PCBs, as well as existing design methodologies and electronic system fabrication technologies and methods.

The progression depicted in views 234-244 begins with a PCB 120 having a set of attachment pads 132 with selectively applied solder paste 246 in view 234, and ends with a completed BGA current meter assembly in view 244. Process operations can be completed using processes and materials presently used for electronic system fabrication such as alignment and solder reflow processes, and solder pastes 246 and 248.

For ease of discussion, the present discussion is directed towards the use of solder paste and solder reflow operations used to establish durable mechanical and electrical connections between an IC package and a PCB. It can be understood, however, that within the scope and spirit of the present disclosure that other types of conductive attachment materials such as conductive epoxies and conductive elastomers can be used for the purpose of establishing such durable mechanical and electrical connections. Accordingly, it can also be understood that, according to embodiments, particular variations of process operations described herein can be used to affix such conductive attachment materials to an IC package and/or a PCB.

The results of one or more process operations can be depicted in each view. For example, a view can depict the results of an attachment process, which can also include placement, alignment, and solder reflow operations that support the attachment process. Processing operations associated with views 234-244 can include, but are not limited to solder application, packaged IC movement and alignment, current sense wire placement, solder ball placement/alignment, and solder reflow operations.

Completed structures can be generally shown in views 234-244 as having rectangular cross-sectional profiles, with surfaces orthogonal to each other. This depiction, however, is not limiting; structures can be of any suitable shape, size and profile, in accordance with specific design criteria, lithographic and manufacturing process limitations and tolerances for a given application. For example, corners shown as having right angles can be rounded, surfaces can have a non-orthogonal relative orientation, and relative dimensional ratios can vary from those depicted in the figures.

Unless explicitly directed towards another figure or view, it can be understood that textual references to figure elements contained within a discussion of an operation of method 200 generally refer to a corresponding view immediately to the right of the discussed operation box of flow diagram 200.

Method 200 moves from start 202 to operation 204. Operation 204 generally refers to selectively applying a conductive attachment material such as solder paste 246 to a set of attachment pads 132 located on an upper surface 138 of a PCB 120. The PCB 120 includes a set of attachment pads 132, attached to a planar upper surface 138 of the PCB 120. According to embodiments, the solder paste 246 can be applied to attachment pads 132 through the use of one or more stencils. Solder stencils can be useful in selecting which attachment pads 132 receive solder paste 246, and which attachment pads 132 are kept free of solder paste 246. Selective application of solder paste can be used to define the path of contiguous channel 134. View 234 depicts the attachment pads 132 following the application of solder paste 246.

In embodiments, solder paste 246 is generally a high-temperature solder paste chosen so that temperature excursions experienced during a subsequent second reflow operation involving a lower temperature solder paste do not cause the high-temperature solder paste to melt a second time. Once conductive attachment material is applied to the set of attachment pads 132, the method 200 moves to operation 206.

Operation 206 generally refers to selectively placing solder balls 102 onto attachment pads 132. Operation 206 is generally consistent with processes, materials and machinery used to attach a BGA package assembly 218 to a PCB 120 by placing solder balls 102 onto attachment pads 132 prepared with solder paste 246. According to embodiments, solder balls 102/102A can be located onto solder paste 246 on attachment pads 132 through the use of one or more masks. Solder ball masks can be useful in selecting which attachment pads 132 are populated with solder balls 102/102A, and which attachment pads 132 are kept vacant of solder balls. Solder balls 102/102A are located such that the bottom surface of each solder ball 102/102A is pressed against and into the solder paste 246.

According to embodiments, once a solder ball mask has been populated, it can be aligned with PCB 120, for example, through the use of robotic equipment having optical sensors. Such optical sensors can detect alignment or fiducial marks located on a solder ball mask and located on PCB 120. Selective locating of solder balls can be used to further define the path of contiguous channel 134. View 234 depicts the attachment pads 132 following the selective locating of solder balls 102/102A. Once the solder balls 102/102A have been selectively placed onto attachment pads 132, the method 200 moves to operation 208.

Operation 208 generally refers to reflowing the solder balls 102/102A to bond them to the attachment pads 132. View 238 depicts a PCB 120 having the set of attachment pads 132 adjacent to a corresponding set of solder balls 102/102A. Following the solder ball location of operation 206, the PCB 120, solder paste 246 and solder balls 102/102A are subjected to a heating operation that reflows solder paste 246 to form a connection between attachment pads 132 and solder balls 102/102A. Once the solder balls 102 have been reflowed to the attachment pads 132, the method 200 moves to operation 210.

Operation 210 generally refers to placing and attaching a current sense wire 114, within the contiguous channel 134, to an upper surface 138 of PCB 120. According to embodiments, current sense wire 114 is formed in a loop that surrounds a subset 102A of the set solder balls 102. In embodiments current sense wire 114 can be attached to vacant attachment pads 132 within the contiguous channel 134 through the use of a wire bonding machine, consistent with machinery used to wire bond ICs to IC packages. For example, a wire bonding machine could be used to form the loop by bonding or stitching current sense wire 114 to the "corner" attachment pads 132 within the contiguous channel 134. According to embodiments, other means of attaching the current sense wire 114 can include robotic machinery that forms a loop of current sense wire 114 and uses epoxy, heat-activated adhesive or another type adhesive to attach the current sense wire 114 to vacant attachment pads 132 within the contiguous channel 134.

According to embodiments, the current sense wire can be fabricated from a metal including, but not limited to, aluminum, copper and copper alloys. In some embodiments the current sense wire includes a laminated outer insulating layer selected from the group consisting of polyimide, polyamide, polyvinyl formal (Formvar), polyurethane, polyester, polyester-polyimide, polyamide-polyimide, amide-imide, polymer and insulating varnish.

View 240 depicts the PCB 120 having a current sense wire 114 attached to its upper surface 138. Once the current sense wire 114 is placed and attached to the upper surface 138 of PCB 120, the method 200 moves to operation 212.

Operation 212 generally refers to aligning a BGA package assembly 218 with a PCB 120. According to embodiments, once a current sense wire 114 has been attached to the PCB 120, the BGA package assembly 218 can be aligned with PCB 120, for example, through the use of robotic equipment having optical sensors. Such optical sensors can detect alignment or fiducial marks located on the BGA package assembly 218 and located on PCB 120.

Prior to a reflow operation detailed in operation 214, attachment pads 130 located on lower surface 136 of BGA package 104 are prepared with a coating of solder paste 248. In embodiments, solder paste 248 is generally a low-temperature or eutectic solder paste chosen so that temperature excursions experienced during a subsequent second reflow operation do not cause the high-temperature solder paste, reflowed in operation 208, to melt a second time.

View 242 depicts a BGA package assembly 218 properly aligned with a corresponding PCB 120, i.e., the attachment pads 130 are aligned with corresponding solder balls 102/102A. View 242 also depicts the attachment pads 130 following the application of solder paste 248. Once the BGA package assembly 218 is aligned with the PCB 120, the method 200 moves to operation 214.

Operation 214 generally refers to attaching a BGA package assembly 218 to PCB 120 by attaching the solder paste 248 of the BGA package assembly 218 to corresponding solder balls 102/102A. According to embodiments, BGA package assembly 218 is positioned so that solder paste 248 on attachment pads 130 is pressed into the tops of solder balls 102/102A. The BGA package assembly 218 is held in position against the PCB 120 during the duration of a reflow process, until the attachment of solder balls 102/102A to attachment pads 130 is mechanically stable. The positioning and holding can be performed by automated or manual assembly equipment.

View 244 depicts a completed BGA current meter 100 apparatus having a BGA package assembly 218 electrically and mechanically attached to a PCB 120, where a set of solder balls 102A carrying supply current to an IC 106 is surrounded by a current sense wire 114. Once the BGA package assembly 218 is attached to PCB 120, the method 200 may end at block 216.

Figure 3:
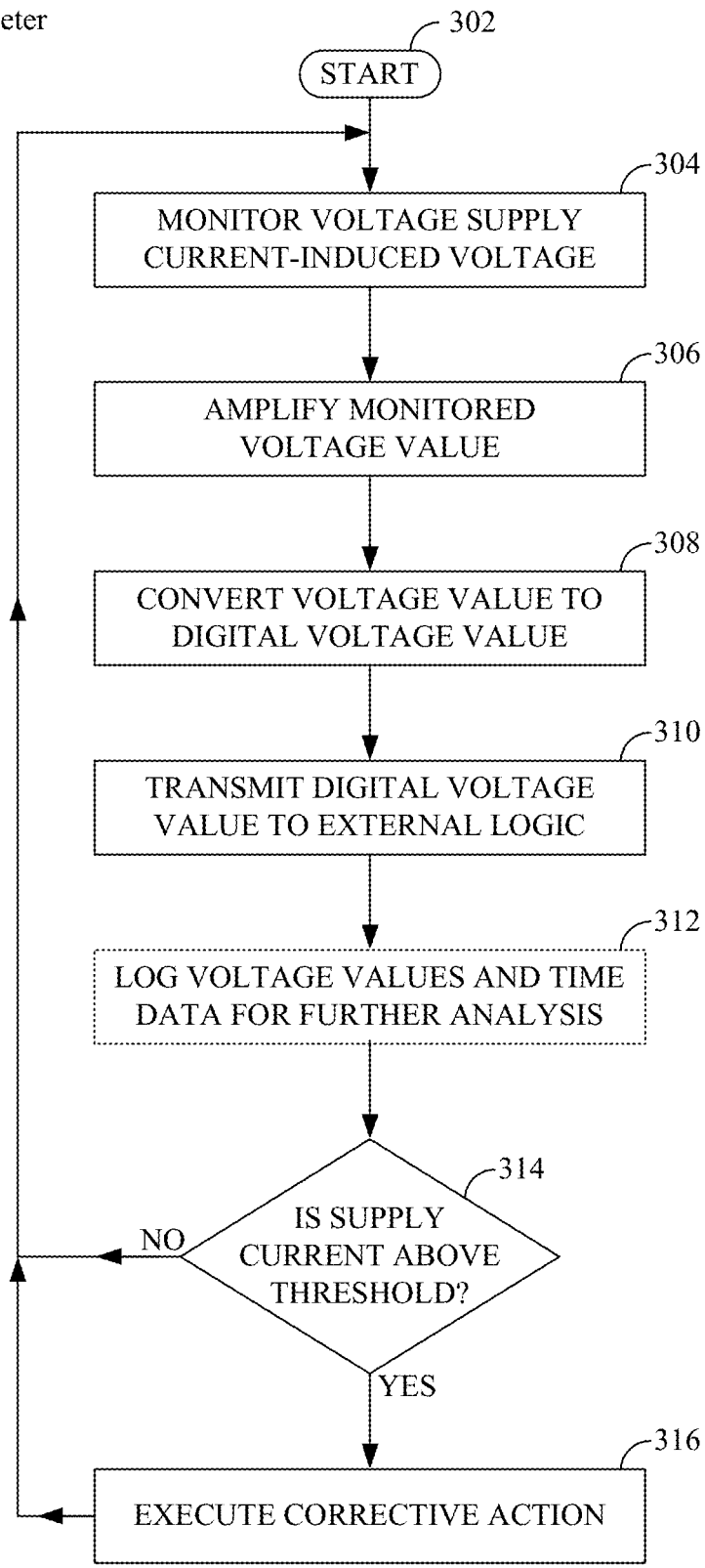
FIG. 3 depicts a flow diagram depicting a method for operating a BGA current meter, according to embodiments consistent with the figures.

FIG. 3 is a flow diagram depicting a method 300 for operating a BGA current meter apparatus 100, FIG. 1, which is configured to measure electrical current flow in a BGA package 104, FIG. 1, according to embodiments consistent with the figures. The use of method 300 can be useful in providing cost-effective in-situ IC current monitoring and corrective action responses for use with current-consuming electronic devices such as ICs. When used in conjunction with a functioning electronic system, method 300 can provide robust monitoring and protection features to the system, and can further provide valuable operational history and diagnostic data to system designers and operators.

The method 300 moves from start 302 to operation 304. Operation 304 generally refers to monitoring, with a current sense wire, e.g., 114, FIG. 1, a voltage induced by supply current flowing into a BGA package 104, FIG. 1. According to embodiments, current sense wire 114 surrounds a group of solder balls 102A that are electrically connected to conduct a supply current into the BGA package 104. When current flows through BGA package 104 into IC 106, FIG. 1, magnetic flux is produced in the solder balls 102A, and this magnetic flux produces a resulting proportional voltage in current sense wire 114. Current sense wire 114 is electrically connected to amplifier 108, FIG. 1, so that amplifier 108 can receive the voltage monitored by current sense wire 114. In some embodiments, the voltage induced on current sense wire 114 results from supply current flowing to a single IC 106, and in some embodiments, the induced voltage results from supply current flowing to two or more ICs 106. Once the voltage induced by supply current has been monitored, the method 300 moves to operation 306.

Operation 306 generally refers to amplifying, with an amplifier circuit, e.g., amplifier 108, FIG. 1, the voltage monitored by current sense wire 114 to produce an amplified voltage that represents supply current flowing through solder balls, e.g., 102A, FIG. 1. According to embodiments, amplifier 108 can receive, at inputs, a differential monitored voltage from current sense wire 114, and produce an amplified voltage proportional to the differential voltage at amplifier output 126, FIG. 1. In some embodiments the amplifier 108 can be an operational amplifier, and in some embodiments, the amplifier 108 can be fabricated as part of an amplifier/sense IC 116.

A gain of amplifier 108 can be chosen/specified or designed by an IC designer to produce an output voltage in a range that is compatible with the input of sensing ADC 110, FIG. 1. For example, if an amplifier input differential voltage range of 108 of 0.0 V to 10 mV is assumed, an amplifier gain of 100 can be chosen to produce an output range of 0.0 V to 1.0 V, which can be compatible with the input range of sensing ADC 110, FIG. 1. Once the monitored voltage has been amplified, the method 300 moves to operation 308.

Operation 308 generally refers to converting, with an ADC, the amplified voltage into a digital value representing the supply current. According to embodiments, such a conversion to a set of digital signals can be useful in providing, to other devices such as external logic device 112, signals representing supply current flowing through solder balls 102A to IC 106 that are more accurately transmitted than an analog signal.

According to embodiments, sensing ADC 110, FIG. 1, can include various types of converters such as a flash ADC, a resistor ladder ADC, a parallel comparator ADC, a successive-approximation ADC and a counter-type ADC. An IC designer can select a particular type of ADC in order to meet particular design criteria such as conversion speed, power usage or IC area consumption.

In embodiments, digital outputs 128, FIG. 1, can include any number of wires needed to represent a corresponding precision of the binary number representing the magnitude of current flow to the IC 106. For example, according to embodiments digital outputs 128 can include 8, 16, 32 or 64 wires, in accordance with the precision of the binary number represented by digital outputs 128. Once the amplified voltage has been converted into a digital value representing the supply current, the method 300 moves to operation 310.

Operation 310 generally refers to transmitting, with the ADC, the digital value to an external logic device. According to some embodiments, as depicted in FIG. 1, a number of conductors carrying digital signals between sensing ADC 110 and external logic device 112 can be used in conducting these signals in a parallel fashion. For example, a set of output drivers of sensing ADC 110 could drive "n" parallel signals over digital outputs 128 to external logic device 112. In some embodiments, external logic device 112 can be located adjacent to sensing ADC 110, for example, on the same PCB 120.

In some embodiments, external logic device 112 can be located remote to sensing ADC 110, for example, within an equipment rack on a separate PCB. In some embodiments, the digital value produced by sensing ADC 110 can be transmitted to external logic device 112 through a serial interconnection scheme such as a high-speed serial bus, network, Universal Serial Bus (USB), FireWire, or other type of serial interconnect scheme. Once the digital value has been transmitted to the external logic device, the method 300 moves to operation 312.

Operation 312 generally refers to an optional operation of logging, with the external logic device 112, FIG. 1, the digital value and a corresponding time value. According to embodiments, the external logic device 112 can include, but is not limited to, a processor or processor core, a computer system, a service processor, a test instrument and an external logic IC configured to receive binary number from sensing ADC 110. In embodiments, one or more the digital values and corresponding time values can be logged with the external logic device 112. Logging can included recording digital values and corresponding time values in a storage medium such as a memory device, or data storage device, e.g., hard disk or solid-state drive (SSD). Such logging of data value(s) can be useful in creating a set of data which can be analyzed for short-term or long-term trends, certain "over limit" or "over threshold" events, and the like. A log of data representing supply current vs. time can be particularly useful in providing an accurate history and insights into IC power consumption and performance that can supersede history and insights provided by IC power simulations alone. Once the digital value and a corresponding time value has been logged, the method 300 moves to operation 314.

At operation 314, a determination is made by the external logic device 112, FIG. 1, regarding whether the supply current, represented by the digital value, is above a specified threshold. A specified threshold, determined by an IC designer, possibly in conjunction with a review of IC simulation results, can be stored within the external logic device 112, and used as a reference value against which to compare a series of measured supply current values. For example, a preset value of 85 A could be stored within a SSD of the external logic device 112, and can be compared against each received digital value representing current supplied to IC 106. If the supply current represented by the digital value is not above the specified threshold, the method 300 returns to operation 304. If the supply current represented by the digital value is above the specified threshold, the method 300 moves to operation 316.

Operation 316 generally refers to initiating, with the external logic device 112, FIG. 1, in response to the supply current, represented by the digital value being above the specified threshold, a corrective action. In some embodiments, current spikes and/or power draw that exceed design specification(s) can be monitored and detected, allowing corrective actions such as shutting down the electronic system containing the IC before any product damage occurs. In some embodiments, a corrective action can be initiated in response to a single supply current value exceeding the predetermined threshold, and a corrective action can be initiated only in response to a series of multiple supply current values exceeding the predetermined threshold.

According to embodiments, corrective actions can include but are not limited to, shutting down an electronic system including the IC 106, reducing the current and/or voltage supplied to IC 106, sending a notification message, e.g., Short Messaging Service (SMS) message or email, to an operator of the electronic system or activating a warning indicator such as an light-emitting diode (LED), audio alarm, or the like. Once the corrective action has been initiated, the method 300 returns to operation 304.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A ball grid array (BGA) current meter apparatus for measuring electrical current flow in a BGA package, the BGA current meter apparatus comprising:
   an integrated circuit (IC), electrically connected to the BGA package;
   a set of solder balls electrically connected to a corresponding first set of attachment pads located on a lower surface of the BGA package;
   a subset of the set of solder balls electrically connected to supply current to the IC;
   a printed circuit board (PCB) including:
      a second set of attachment pads positionally corresponding to the first set of attachment pads;
      a current sense wire attached to further attachment pads located on an upper surface of the PCB and located in a contiguous channel, the current sense wire surrounding the subset of solder balls;
   an amplifier electrically connected to ends of the current sense wire, the amplifier configured to amplify a voltage induced on the current sense wire by current flow into the BGA package; and
   a sensing analog-to-digital converter (ADC) electrically connected to and configured to convert, into digital output signals, a voltage at the output of the amplifier.

2. The BGA current meter apparatus of claim 1, further comprising a second IC electrically connected to the BGA package, wherein the subset of the set of solder balls is further electrically connected to supply, from a PCB, current to the second IC.

3. The BGA current meter apparatus of claim 1, wherein the current sense wire is fabricated from a metal selected from the group consisting of: aluminum and copper.

4. The BGA current meter apparatus of claim 1, wherein the current sense wire includes a laminated outer insulating layer selected from the group consisting of: polyimide, polyamide, polyvinyl formal (Formvar), polyurethane, polyester, polyester-polyimide, polyamide-polyimide, amide-imide, polymer and insulating varnish.

5. The BGA current meter apparatus of claim 1, further comprising an external logic device electrically connected to receive the digital output signals from the ADC.

6. The BGA current meter apparatus of claim 5, wherein the external logic device is selected from the group consisting of: a computer system, a processor, a service processor, a test instrument and an external logic IC.

7. The BGA current meter apparatus of claim 5, wherein the external logic device is configured to initiate a corrective action in response to receiving digital output signals representing a current that is above a threshold.

8. The BGA current meter apparatus of claim 5, wherein the external logic device is located on the PCB.

9. The BGA current meter apparatus of claim 5, wherein the external logic device is located in location remote to the PCB.

\* \* \* \* \*